(12) United States Patent
Yamada

(10) Patent No.: US 7,372,390 B2
(45) Date of Patent: May 13, 2008

(54) ANALOG-DIGITAL CONVERTER CIRCUIT

(75) Inventor: Toshimi Yamada, Miyazaki (JP)

(73) Assignee: Oki Electric Industry Co., Ltd, Tokyo (JP)

( * ) Notice: Subject to any disclaimer, the term of this patent is extended or adjusted under 35 U.S.C. 154(b) by 0 days.

(21) Appl. No.: 11/655,172

(22) Filed: Jan. 19, 2007

(65) Prior Publication Data

US 2007/0188367 A1   Aug. 16, 2007

(30) Foreign Application Priority Data

Feb. 10, 2006  (JP)  ............................. 2006-033594

(51) Int. Cl.
  *H03M 1/12*  (2006.01)
(52) U.S. Cl. ..................... 341/155; 341/122; 341/159
(58) Field of Classification Search ................ 341/122, 341/159
  See application file for complete search history.

(56) References Cited

U.S. PATENT DOCUMENTS 5,061,926 A * 10/1991 Washiyama ................. 341/122
5,861,829 A * 1/1999 Sutardja ..................... 341/122
5,936,566 A * 8/1999 Park ............................. 341/159
6,107,949 A * 8/2000 Gross, Jr. .................... 341/159
7,102,559 B2 * 9/2006 Van Tuijl .................... 341/156

FOREIGN PATENT DOCUMENTS

JP    07-038439    2/1995

\* cited by examiner

*Primary Examiner*—Khai M. Nguyen
(74) *Attorney, Agent, or Firm*—Donald R. Studebaker

(57) ABSTRACT

The present invention provides a multi-input A/D converter circuit capable of shorting a conversion time without increasing its layout area and current consumption. When a most significant bit of a binary counter is "L", individual input signals are sampled by a sample and hold unit, and digital signals held in respective data holders are sequentially selected by a selector. When the most significant bit is brought to "H", the respective input signals are held as analog signals and compared with each of reference voltages produced corresponding to a digital signal by a DAC. When decision signals outputted from comparators are changed from "L" to "H", the digital signal at that time is held in the individual data holders as digital signals.

3 Claims, 4 Drawing Sheets

(a) WHOLE CONFIGURATION (b) DATA HOLDER 50

US 7,372,390 B2

ANALOG-DIGITAL CONVERTER CIRCUIT

BACKGROUND OF THE INVENTION

The present invention relates to an analog/digital (hereinafter called "A/D") converter circuit, and particularly to a multi-input A/D converter circuit.

FIG. 2 is a schematic configuration diagram of a conventional A/D converter circuit.

The present A/D converter circuit performs processing on a multi-input and has input terminals $11_i$ respectively inputted with analog input signals INi (where i=1 to 256). Capacitors $13_i$ and buffers $14_i$ are respectively connected to the input terminals $11_i$ via switches $12_i$. The capacitors $13_i$ respectively hold the input signals INi sampled by the switches $12_i$ and have other ends connected to a ground potential GND. The buffers $14_i$ are used to output the voltages (input signals INi) held in the capacitors $13_i$ at low impedance without changing the voltages. The buffers $14_i$ are constituted of voltage-follower connected operational amplifiers or the like. A node NA is connected to the output sides of the buffers $14_i$ via switches $15_i$. An A/D converter (hereinafter called "ADC") 16 is connected to the node NA. A digital output signal OUT is outputted from the ADC 16.

In the A/D converter circuit, all the switches $12_1$ through $12_{256}$ are turned on during a sampling period, and the input signals IN1 through IN256 are applied to their corresponding capacitors $13_1$ through $13_{256}$. At this time, the switches $15_1$ through $15_{256}$ are all off. When the sampling period is ended, all the switches $12_1$ through $12_{256}$ are turned off and hence the input signals IN1 through IN256 are retained in their corresponding capacitors $13_1$ through $13_{256}$, so that a hold period is reached.

When the hold period is reached, the switch $15_1$ is first turned on so that the same voltage as the input signal IN1 held in the capacitor $13_1$ is outputted from the buffer $14_1$ to the node NA through the switch $15_1$. Then, the analog voltage of the node NA is converted into a digital signal by the ADC 16, which in turn is outputted as an output signal OUT.

Next, the switch $15_1$ is turned off and the switch $15_2$ is turned on. Then, the same voltage as the input signal IN2 retained in the capacitor $13_2$ is outputted from the buffer $14_2$ to the node NA through the switch $15_2$ and converted into a digital signal by the ADC 16, which in turn is outputted as an output signal OUT. Thus, the output voltages of the buffers $14_1$ through $14_{256}$ are sequentially switched by the switches $15_1$ through $15_{256}$ and converted into their corresponding digital signals in turn by the ADC 16.

The above prior refers to a patent document 1 (Japanese Unexamined Patent Publication No. Hei 7(1995)-38439).

The A/D converter circuit involves, however, the following problems.

That is, the buffers $14_1$ through $14_{256}$ are provided for impedance transformation and circuit separation. The selector switches $15_1$ through $15_{256}$ provided on the output sides of the buffers $14_1$ through $14_{256}$ are sequentially turned on/off to supply the output voltages of the buffers $14_1$ through $14_{256}$ to the ADC 16 in turn, after which they are converted into their corresponding digital values. Since there is a need to prepare the buffers 14 by the same number as the input signals IN, a layout area occupied by theses buffers 14 and current consumption thereof increase as the number of the input signals increases. Thus, it is difficult to provide a large number of high-capacity buffers. Only buffers small in capacity are provided and hence drive capacity is restricted. Therefore, a problem arises in that when each of the switches 15 is turned on and the output voltage of each buffer 14 is outputted to the node NA, a response time required up to the stabilization of each voltage of the node NA becomes longer.

Assuming that, for example, a load capacitance C connected to the node NA is 5 pF, an output current I of one buffer 14 is 5 µA and a response voltage V of the buffer 14 is 5V, an electrical charge Q charged to the load capacitance is placed in a relationship of Q=CV=IT (where T: time during which the output current I flows). Therefore, the time becomes T=5 pF×5V/5 µA=5 µs. Assuming that the response time required to stabilize the voltage of the node NA is 4 T, the response time becomes 20 µs.

Assuming that a sampling speed is set to 10 MHz or so where the ADC 16 is of a normal successive approximation type, the time required to convert data becomes 1 µs or so. Therefore, the sum of time intervals required to A/D-convert the input signals IN1 through IN256 results in about 5.4 ms (256×21 µs). Even though the high-speed ADC 16 having the sampling speed of 40 MHz is used, the sum of the A/D conversion times almost remains unchanged because the response times of the buffers 14 are dominant over the A/D conversion times.

As a method for shortening the A/D conversion time, there is known one wherein a plurality of ADCs are prepared to perform AD conversions in parallel. This has however a fear that a layout area and current consumption increase.

SUMMARY OF THE INVENTION

The present invention aims to provide a multi-input A/D converter circuit capable of shortening a conversion time without increasing a layout area thereof and current consumption thereof.

According to one aspect of the present invention, for attaining the above object, there is provided an analog/digital converter circuit comprising:

a sample and hold unit which supplies m (where m: plural) analog input signals to their corresponding voltage holding capacitors via switches during a sampling period and cuts off the switches during a hold period to output the voltages held in the capacitors as analog voltages;

a DAC which generates reference voltages increased or decreased in a stepwise form of n (where n: plural) stages in accordance with a digital value during the hold period;

m comparators which are respectively provided corresponding to the input signals and which compare each of the reference voltages and the analog voltages outputted from buffer amplifiers in the sample and hold unit during the hold period and output decision signals therefrom;

m data holders which are respectively provided corresponding to the comparators and hold the digital value at the time that the decision signals outputted from the comparators have changed during the hold period, as digital signals;

a selector which sequentially selects the digital signals held in the m data holders in accordance with the digital value during the sampling period; and a counter which counts from 0 to at least m-1 in sync with a clock signal during the sampling period and outputs a count value thereof as the digital value, and which counts from 0 to at least n-1 in sync with the clock signal during the hold period and outputs a count value thereof as the digital value.

In the present invention, there are provided comparators which compare voltages held in capacitors every plural input signals with each of reference voltages changed in stepwise form, which are supplied from a DAC. Thus, since the plural input signals are compared with each reference voltage in parallel, there is no need to switch the input signals for the purpose of conversion, and a waiting time necessary up to the stabilization of each input signal becomes unnecessary, whereby a conversion time can be shortened. Advantageous effects are brought about in that since digital values corresponding to the reference voltages at the time that decision signals compared with the reference voltages every input signals have changed are retained, a circuit configuration is simplified and a layout area and current consumption can be suppressed.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
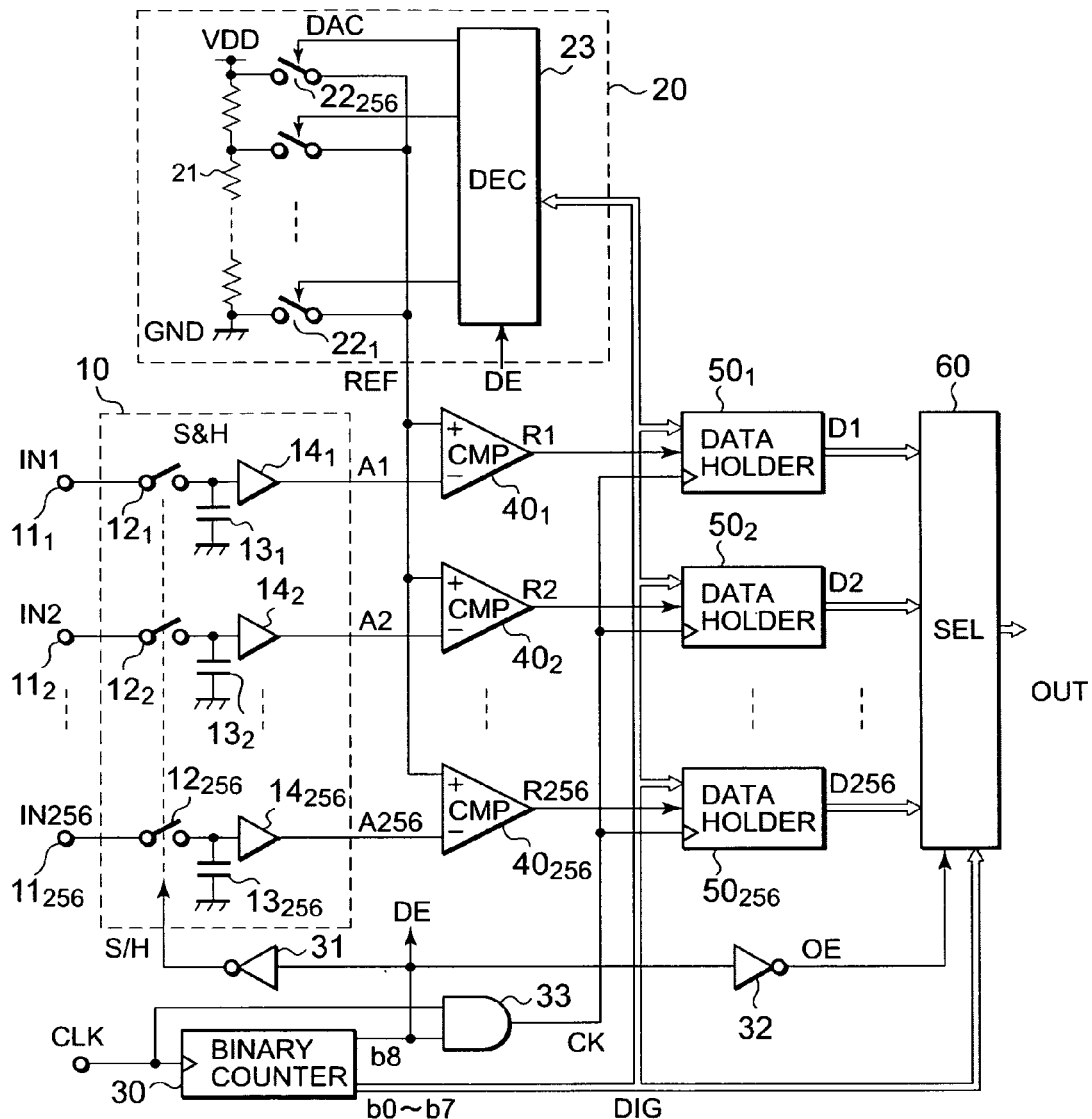
FIG. 1 is a configuration diagram of an A/D converter circuit showing a first embodiment of the present invention.
Figure 1:
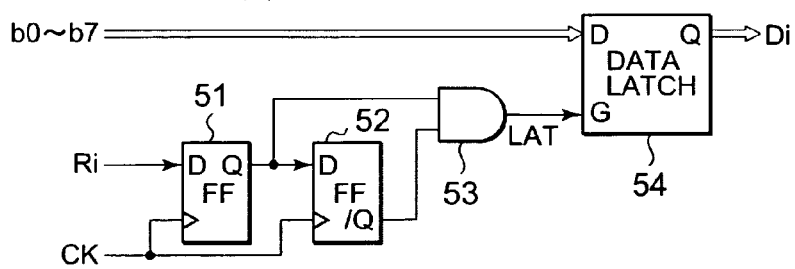
Figure 2:
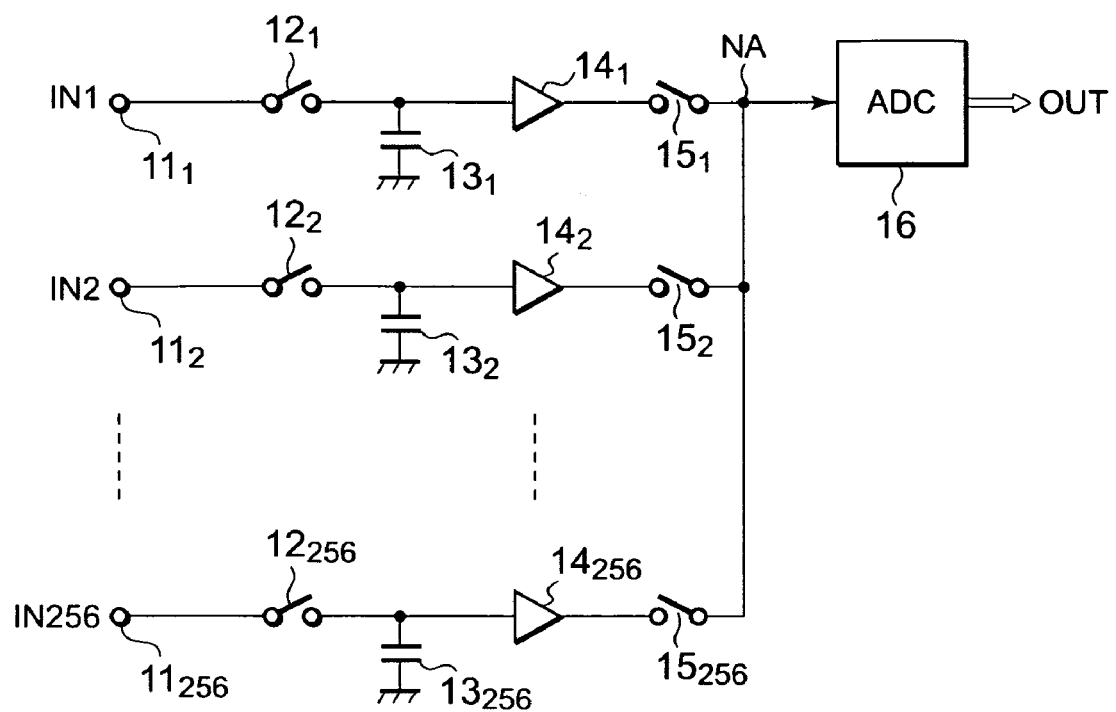
FIG. 2 is a configuration diagram of a conventional A/D converter circuit.

The above and other objects and novel features of the present invention will become more completely apparent from the following descriptions of preferred embodiments when the same is read with reference to the accompanying drawings. The drawings, however, are for the purpose of illustration only and by no means limitative of the invention.

First Preferred Embodiment

FIGS. 1(a) and 1(b) are configuration diagrams of an A/D converter circuit showing a first embodiment of the present invention.

The present A/D converter circuit processes a multi-input (e.g., 256 inputs) and includes a sample and hold unit (S&H) 10, a digital/analog converter (hereinafter called "DAC") 20 and a binary counter 30 as shown in FIG. 1(a).

The sample and hold unit 10 has input terminals $11_i$ respectively inputted with analog input signals INi (where i=1 to 256). Capacitors $13_i$ and buffers $14_i$ are respectively connected to the input terminals $11_i$ via switches $12_i$. The capacitors $13_i$ respectively hold the input signals INi sampled by the switches $12_i$ and have other ends connected to a ground potential GND. The buffers $14_i$ are used to output analog voltages Ai at low impedance without changing the voltages (input signals INi) retained in the capacitors $13_i$. The buffers $14_i$ are constituted of voltage-follower connected operational amplifiers or the like.

The DAC 20 outputs analog reference voltages REFs corresponding to a digital signal DIG. The DAC 20 comprises a resistance voltage divider 21 which divides a voltage between a power supply potential VDD and the ground potential GND into voltages corresponding to 256 stages or levels, for example, switches $22_i$ for switching between the 256-level voltages divided by the resistance voltage divider 21 and outputting the switched voltages as the reference voltages REFs, respectively, and a decoder (DEC) 23 which decodes the digital value DIG and outputs signals for on/off-controlling the switches $22_i$. Incidentally, the decoder 23 is set in such a manner that its operation is controlled by a control signal DE and the switch $22_1$ for outputting the ground potential GND is turned on when the operation thereof is prohibited. The DAC 20 is configured such that when it is brought to an operating state by the control signal DE, the reference voltages REFs rise as the digital value DIG increases.

The binary counter 30 is of a 9-bit counter, for example. This counter counts a clock signal CLK and outputs its count value CNT therefrom. Lower 8 bits (bits b0 through b7) of the count value CNT are supplied to the decoder 23 as the digital value DIG.

Further, the A/D converter circuit has 256 comparators (CMPs) $40_i$ associated with the analog voltages Ai outputted from the sample and hold unit 10, and 256 data holders $50_i$ corresponding thereto. The respective comparators $40_i$ respectively compare the analog voltages Ai and the reference voltages REFs. The comparators $40_i$ output decision signals Ri respectively brought to a level "L" when Ai≧REFs and respectively brought to a level "H" when Ai<REFs. The respective data holders $50_i$ retain therein a digital value DIG when the decision signals Ri outputted from the comparators $40_i$ change from "L" to "H" and output the same as digital signals Di, respectively. The digital signals Di outputted from the respective data holders $50_i$ are supplied to a selector 60.

The selector 60 selects the digital signals Di in accordance with the digital value DIG constituted of the lower 8 bits (bits b0 through b7) of the count value CNT when it is brought to an outputtable state by a control signal OE, and outputs the selected signal as an output signal OUT.

Incidentally, the most significant bit b8 of the binary counter 30 is supplied to the DAC 20 as a control signal DE and inverted by inverters 31 and 32, which inverted ones are then supplied as a control signal S/H for on/off-controlling the switches $12_1$ through $12_{256}$ of the sample and hold unit 10 and a control signal OE for controlling the selector 60. Further, the most significant bit b8 and the clock signal CLK are supplied to an AND gate (hereinafter called "AND") 33. The clock signal CLK gate-controlled based on the most significant bit b8 is supplied to the respective data holders $50_i$ as a clock signal CK.

The respective data holders $50_i$ are identical in configuration to one another. As shown in FIG. 1(b) by way of example, each of the data holders comprises a change detection unit constituted of flip-flops (hereinafter called "FFs") 51 and 52 and an AND 53 for detecting that the decision signal Ri has been changed from "L" to "H" and outputting a latch signal LAT, and a data latch 54 which latches a digital value DIG in response to the latch signal LAT and outputs the same as a digital signal Di. That is, the data holder is configured in such a manner that the FFs 51 and 52 are connected in tandem and operated in sync with the common clock signal CK, an output terminal Q of the FF 51 and an inverse output terminal /Q of the FF 52 are connected to their corresponding input sides of the AND 53, and the latch signal LAT is outputted from the output side of the AND 53.

Figure 3:
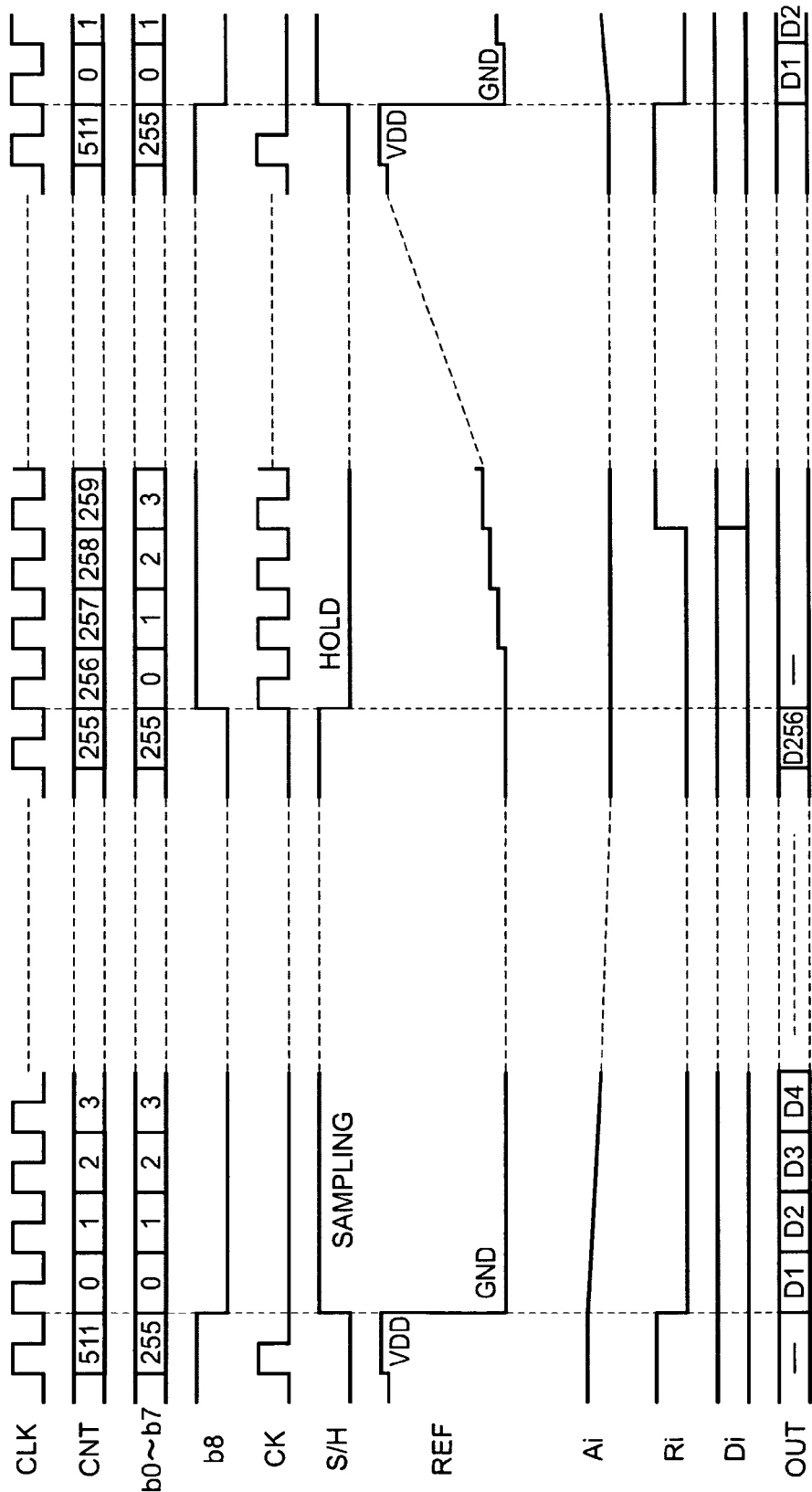
FIG. 3 is a signal waveform diagram showing operation of FIG. 1.

FIG. 3 is a signal waveform diagram showing the operation of FIG. 1. The operation of the present A/D converter circuit is divided into a sampling/output period in which a count value CNT ranges from 0 to 255, and a conversion period in which the count value CNT ranges from 256 to 511. The operation of FIG. 1 will be explained below with reference to FIG. 3 with being divided into a sampling/output operation (1) and a conversion operation (2).

(1) Sampling/Output Operation

While the count value CNT ranges from 0 to 255, the most significant bit b8 goes "L", the control signal DE and the clock signal CK go "L", and the control signals S/H and OE go "H". Since the control signal DE is "L", the operation of the DAC 20 is stopped and hence the reference voltage REF is brought to the ground potential GND. Since the clock signal CK is fixed to "L", the change detection units of the respective data holders $50_i$ are also deactivated. Accordingly, the digital signals Di latched in the respective data holders $50_i$ remain unchanged.

On the other hand, the control signal S/H is brought to "H" and the switches $12_1$ through $12_{256}$ of the sample and hold unit 10 are all turned on. Thus, the input signals INi supplied to the respective input terminals $11_i$ are respectively applied to the capacitors $13_i$ via their corresponding switches $12_i$. The capacitors $13_i$ are respectively charged to the same voltages as the input signals INi. Then, the same voltages as the input signals INi are outputted from the buffers $14_i$ as their corresponding analog voltages Ai. When the input signals INi change during this period, the analog voltages Ai also change correspondingly.

Since the control signal OE is brought to "H", the operation of the selector 60 is started. Since the digital value DIG is 0 at first, the digital signal D1 of the data holder $50_1$ is selected and outputted as an output OUT. When the digital value DIG is brought to 1 on the rising edge of the next clock signal CLK, the digital signal D2 of the data holder 502 is selected and outputted as an output signal OUT. In like manner subsequently, the digital value DIG increases each time the clock signal CLK rises. The digital signals Di are sequentially outputted as output signals OUT according to the digital value DIG.

Now, assuming that the frequency of the clock signal CLK is 1 MHz, a period during which the respective switches $12_i$ of the sample and hold unit 10 are on, is 256 µs. Thus, it can be said that even though the buffers $14_i$ are small in drive capacity, this period is a time interval enough to stabilize the outputted analog voltages Ai.

(2) Conversion Operation

While the cont value CNT ranges from 256 to 511, the most significant bit b8 is brought to "H", the control signal DE is brought to "H", and the control signals S/H and OE are brought to "L". The output of the clock signal CK is started from the AND 33, and the operations of the change detection units of the respective data holders $50_i$ are started.

Since the control signal S/H goes "L", the switches $12_1$ through $12_{256}$ of the sample and hold unit 10 are all turned off. Thus, the connections between the respective input terminals 11i and the capacitors $13_i$ are cut off so that the voltages applied immediately before the turning off of the switches $12_i$ are respectively held in the capacitors $13_i$ as the input signals INi. Further, the same voltages as the input signals INi retained in the capacitors $13_i$ are outputted from the buffers $14_i$ as analog voltages Ai, which in turn are supplied to their corresponding comparators $40_i$. When the control signal OE is brought to "L", the selector 60 is deactivated.

Since the control signal DE is brought to "H", the operation of the decoder 23 in the DAC 20 is started. Thus, the 256-level voltages divided by the resistance voltage divider 21 are sequentially switched in accordance with the digital value DIG corresponding to the lower 8 bits of the count value CNT, after which they are outputted as their corresponding reference voltages REFs. That is, the reference voltages REFs rise stepwise from the ground potential GND to the power supply potential VDD in accordance with an increase in the digital value DIG.

Each reference voltage REF is supplied to the respective comparators $40_i$ in common. On the other hand, the respective comparators $40_i$ are supplied with their corresponding analog voltages Ai associated with the input signals INi. The comparators $40_i$ respectively compare the analog signals Ai and the corresponding reference voltage REF and outputs decision signals Ri corresponding to the results of comparisons. Since the reference voltage REF rises stepwise from the ground potential GND to the power supply potential VDD, Ai≧REF at first and the decision signals Ri are "L".

When the reference voltage REF rises and Ai<REF is reached, the decision signals Ri change from "L" to "H". When the decision signals Ri change from "L" to "H", latch signals LATs are outputted from the change detection units of the data holders $50_i$, and a digital value DIG at that time is held in the data latches 54 as digital signals Di. Thus, the digital signal Di retained in each of the data latches 54 indicates a digital value DIG at the moment that the reference voltage REF has exceeded the analog signals Ai, i.e., a value corresponding to the reference voltage REF nearly equal to the analog signals Ai. However, the digital signals Di are outputted as the output signals OUT when the count value CNT is returned to 0 after having been increased up to 511 and further the data holders $50_i$ are selected by the count value CNT.

Thus, since the A/D converter circuit according to the first embodiment is provided with the corresponding comparators $40_i$ every plural analog signals Ai, there is no need to provide selector switches on the output sides of the buffers $14_i$ of the sample and hold unit 10. Further, the outputs signals (analog voltages Ai) of these buffers $14_i$ can always be supplied as the input signals of the comparators $40_i$. Accordingly, the A/D converter circuit has advantages in that it is not necessary to prepare those large in drive capacity as the buffers $14_i$ and it is possible to shorten the conversion time without increasing its layout area and current consumption.

Incidentally, assuming that the frequency of the clock signal CLK is set as 1 MHz in the first embodiment, the time required to A/D-convert all of the 256 inputs becomes 512 µs=1 µs×512 counts. This results in 9.5% of the conventional circuit. It is thus possible to greatly shorten the conversion time.

Second Preferred Embodiment

Figure 4:
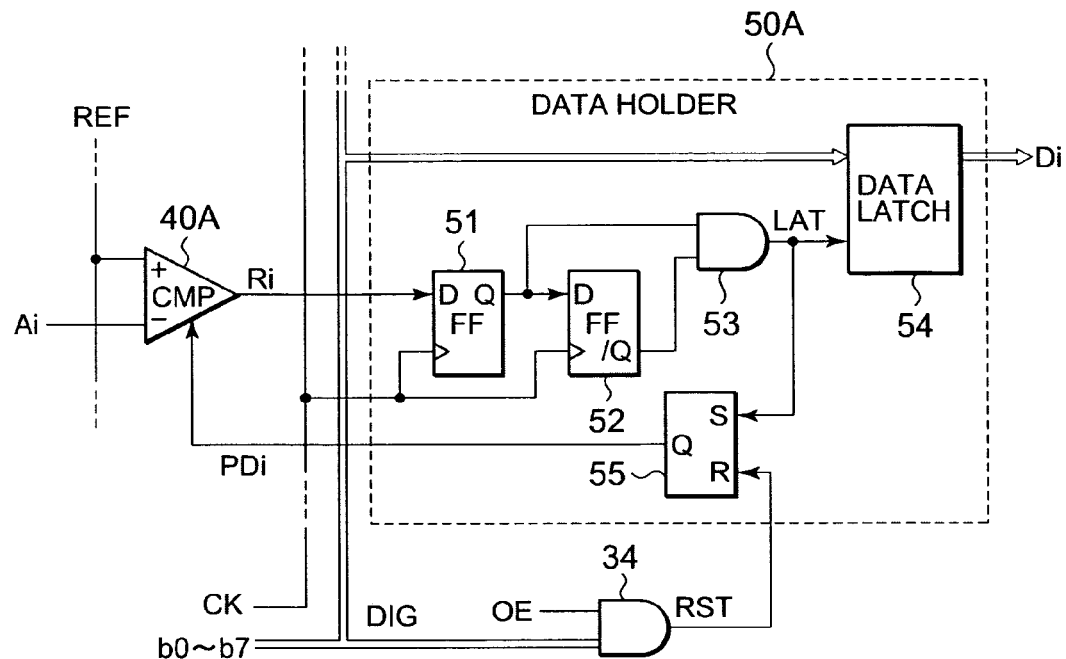
FIG. 4 is a configuration diagram illustrative of a comparator and a data holder showing a second embodiment of the present invention.

FIG. 4 is a configuration diagram illustrative of one of comparators and one of data holders both showing a second embodiment of the present invention.

The comparator 40A and the data holder 50A are provided as an alternative to the comparators $40_i$ and the data holders $50_i$ shown in FIG. 1.

The comparator 40A proceeds to a low power consumption mode when a power control signal PD is given (when PD is brought to "H" in the present embodiment). The comparator can be configured by, for example, providing a switch in a power supply path of each comparator 40 shown in FIG. 1 and on/off-controlling the switch by the power control signal PD.

The data holder 50A additionally has the function of outputting a power control signal PD for the comparator 40A in addition to the function of, when a decision signal Ri changes from "L" to "H", latching a digital value DIG and outputting the same as a digital signal Di. That is, the data holder 50A includes a set/reset type FF 55 in addition to a change detection unit or section comprising FFs 51 and 52 and an AND 53, and a data latch 54 for latching a digital value DIG in response to a latch signal LAT outputted from the change detection unit, both of which are similar to those shown in FIG. 1(b). The latch signal LAT is applied to a set terminal S of the FF 55, and a common reset signal RST is applied to its reset terminal R. A power control signal PD is outputted from an output terminal Q. Incidentally, the reset signal RST is generated by a 9-bit AND 34 inputted with a control signal OE and an 8-bit digital value DIG in such a manner that it is supplied when the count value CNT is 255, for example.

When the count value CNT reaches 255 in the comparator 40A and the data holder 50A, the FF 55 of the data holder 50A is reset by the reset signal RST outputted from the AND 34 so that the power control signal PD is brought to "L". Thus, the operation of the comparator 40A is started.

Then, when the change detection unit of the data holder 50A detects that the decision signal Ri has changed from "L" to "H", a digital value DIG is latched in the data latch 54 in accordance with a latch signal LAT, and the FF 55 is set by the latch signal LAT. Thus, the power control signal PD is brought to "H" so that the operation of the comparator 40A is stopped.

As described above, the data holder 50A of the second embodiment has the function of stopping the power control signal PD (bringing PD to "L") only while it is detecting the change of the decision signal Ri from "L" to "H". The comparator 40A is configured so as to operate only during a period in which the power control signal PD is being stopped. Thus, an advantage is brought about in that needless power consumption can be suppressed.

Third Preferred Embodiment

Figure 5:
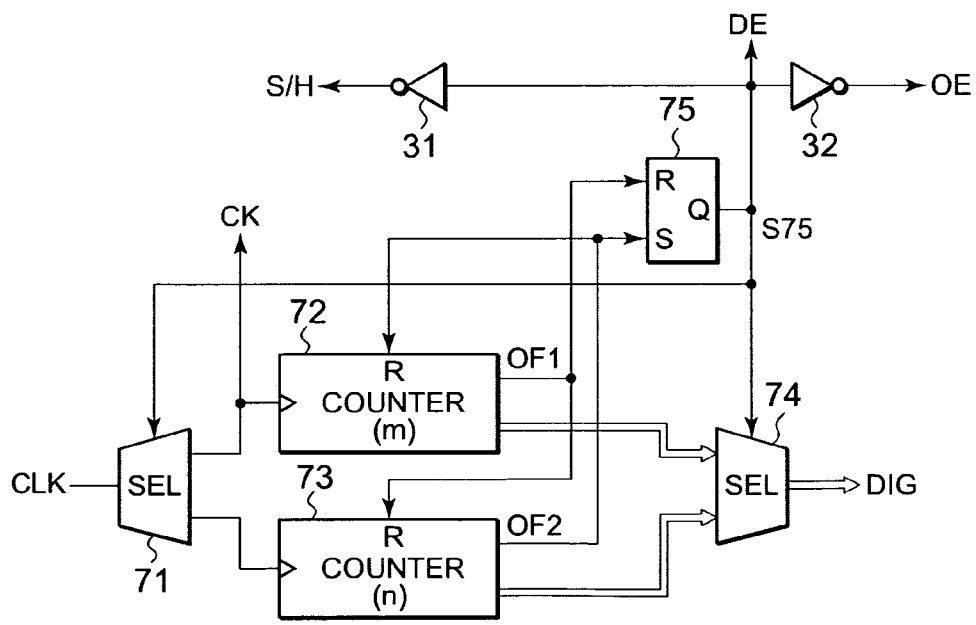
FIG. 5 is a configuration diagram of a timing controller showing a third embodiment of the present invention.

FIG. 5 is a configuration diagram of a timing controller showing a third embodiment of the present invention.

The timing controller is provided as an alternative to the binary counter 30 and its peripheral inverters 31 and 32 and AND 33 shown in FIG. 1 in order to adapt to the arbitrary number m of input signals and the arbitrary number n of reference voltages.

The timing controller has a selector 71 for selecting and outputting a clock signal CLK during a sampling period and a hold period. A counter 72 that counts from 0 to at least m-1 during the hold period is connected to the first output side of the selector 71. A counter 73 that counts from 0 to at least n-1 during the sampling period is connected to the second output side of the selector 71.

Count values of the counters 72 and 73 are applied to their corresponding first and second input sides of a selector 74. The selector 74 selects the count value of the counter 72 during the hold period, and selects the count value of the counter 73 during the sampling period and outputs it as a digital value DIG.

The counters 72 and 73 respectively have functions for outputting overflow signals OF1 and OF2 and reset functions for clearing them to 0 by their corresponding reset signals. The overflow signal OF1 of the counter 72 is applied to a reset terminal R of a set/reset type FF75 and a reset terminal R of the counter 73. The overflow signal OF2 of the counter 73 is applied to a set terminal S of the FF 75 and a reset terminal R of the counter 72.

An output signal S75 of the FF 75 is supplied to the selectors 71 and 74 as a selection signal and outputted as a control signal DE for a DAC 20. Further, the output signal of the FF 75 is inverted by inverters 31 and 32, from which the inverted signals are respectively applied to a sample and hold unit 10 and a selector 60 as control signals S/H and OE. A signal on the first output side of the selector 71 is supplied to respective data holders $50_i$ as a clock signal CK.

In the timing controller, the output signal S75 of the FF 75 is brought to, for example, "H" during the hold period, so that the first output side is selected at the selector 71 and the first input side is selected at the selector 74. Thus, the counter 72 is operated so that its count value is outputted from the selector 74 as a digital value DIG. Further, the clock signal CK outputted from the first output side of the selector 71 is supplied to the respective data holders $50_i$. When the count value of the counter 72 reaches m, the overflow signal OF1 is outputted, so that the FF 75 and the counter 73 are reset. Thus, the output signal S75 of the FF 75 is brought to "L" and hence the sampling controller proceeds to the sampling period.

During the sampling period, the second output side is selected at the selector 71 and the second input side is selected at the selector 74. Hence, the counter 73 is operated so that its count value is outputted from the selector 74 as a digital value DIG. When the count value of the counter 72 increases from 0 sequentially and reaches n, the overflow signal OF2 is outputted so that the FF 75 is set and the counter 72 is reset. Thus, the output signal S75 of the FF 75 goes "H" and hence the timing controller proceeds to the hold period.

As described above, the timing controller of the third embodiment has the two counters 72 and 73 that respectively count the number m of input signals and the number n of reference voltages, and switches them depending on the hold period and the sampling period to output the digital value DIG. Thus, the timing controller has the advantage that the optimum timing control can be carried out corresponding to the arbitrary number m of input signals and the arbitrary number n of reference voltages.

Incidentally, the present invention is, not limited to the above embodiments. Various modifications can be made thereto. As examples for the modifications, the following are cited for instance.

(a) Although the number of input signals IN and the number of reference voltages REFs outputted from the DAC 20 have been explained with being set to the same number (256), they may be different from each other in number. When the number m of the input signals and the number n of the reference voltages are different from each other, the binary counter 30 may be configured so as to be able to count its maximum count value up to twice the large one of m and n.

When, for example, the number m of the input signals is 128 and the number n of the reference voltages indicating resolution of A/D conversion is 256 (8 bits), the binary counter 30 is set to 9 bits. Since, in this case, the corresponding data holder 50 does not exist during the period from 128 to 255 of the digital value DIG at the sampling and output operating periods, no effective output OUT is outputted.

Even when the number m of the input signals is 256 and the number n of the reference voltages is 128, the binary counter 30 is set to 9 bits. In this case, the DAC 20 is configured so as to always output the power supply potential VDD as the reference voltage REF when the digital value DIG ranges from 128 to 255.

(b) The DAC 20 is not limited to the configurations illustrated in the figures. If, for example, a weighting resistance type, a ladder resistance type or the like is used, then the circuit can be simplified because each switch is directly controlled by a binary digital value DIG without using the decoder 23.

(c) Although the DAC 20 is configured in such a manner that each of the reference voltages REFs rises stepwise as the digital value DIG increases, the DAC 20 may be configured in such a manner that the reference voltage REF is lowered stepwise contrary to this. In this case, the levels of the decision signals Ri outputted from the respective comparators $40_i$ may be inverted. Alternatively, the configurations of the respective data holders $50_i$ may be changed in such a manner that the digital value DIG is held when the decision signals Ri have changed from "H" to "L".

(d) Although the data holder 50A shown in FIG. 4 outputs the power control signal PD for the corresponding comparator 40A to deactivate the comparator 40A when the decision signal Ri has changed from "L" to "H", each of the comparators $40_i$ shown in FIG. 1 may be changed to the power controllable comparator 40A shown in FIG. 4 to supply the control signal OE as a power control signal. In such a case, each of the comparators 40A is brought into an operating state during a conversion operating period in which the count value CNT ranges from 256 to 511.

(e) Although the sampling and output operations are carried out at the first half of the count value CNT and the conversion operation is carried out at its latter half, they may be set in reverse.

What is claimed is:

1. An analog/digital converter circuit comprising:

a sample and hold unit which supplies m (where m: plural) analog input signals to their corresponding voltage holding capacitors via switches during a sampling period and cuts off the switches during a hold period to output the voltages held in the capacitors as analog voltages;

a digital/analog converter which generates reference voltages increased or decreased in a stepwise form of n (where n: plural) stages in accordance with a digital value during the hold period;

m comparators which are respectively provided corresponding to the input signals and which compare each of the reference voltages and the analog voltages outputted from buffer amplifiers in the sample and hold unit during the hold period and output decision signals therefrom;

m data holders which are respectively provided corresponding to the comparators and hold the digital value at the time that the decision signals outputted from the comparators have changed during the hold period, as digital signals;

a selector which sequentially selects the digital signals held in the m data holders in accordance with the digital value during the sampling period; and a counter which counts from 0 to at least m−1 in sync with a clock signal during the sampling period and outputs a count value thereof as the digital value, and which counts from 0 to at least n−1 in sync with the clock signal during the hold period and outputs a count value thereof as the digital value.

2. The analog/digital converter circuit according to claim 1, wherein each of the data holders detects a change in the decision signal outputted from each of the comparators and thereafter outputs a power control signal for bringing the corresponding comparator into a standby state during a period in which the following hold period is started.

3. The analog/digital converter circuit according to claim 1, wherein each of the comparators is brought into a standby state during the sampling period.

\* \* \* \* \*